United States Patent
Sasaki (10) Patent No.: US 8,539,310 B2
(45) Date of Patent: Sep. 17, 2013

(54) MEMORY DEVICE AND REFRESH ADJUSTING METHOD

(75) Inventor: Takatsugu Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 816 days.

(21) Appl. No.: 12/425,756

(22) Filed: Apr. 17, 2009

(65) Prior Publication Data

US 2009/0204752 A1 Aug. 13, 2009

Related U.S. Application Data

(63) Continuation of application No. PCT/JP2006/320911, filed on Oct. 20, 2006.

(51) Int. Cl.
*G06F 11/00* (2006.01)

(52) U.S. Cl.
USPC .......................................... 714/764

(58) Field of Classification Search
USPC .................. 714/763, 764; 711/105
See application file for complete search history.

(56) References Cited

U.S. PATENT DOCUMENTS

| | | | |
|---|---|---|---|
| 4,758,992 A | 7/1988 | Taguchi | |
| 4,888,773 A * | 12/1989 | Arlington et al. | 714/764 |
| 4,935,900 A | 6/1990 | Ohsawa | |
| 7,246,269 B1 * | 7/2007 | Hamilton | 714/42 |
| 2002/0004921 A1 | 1/2002 | Muranaka et al. | |
| 2003/0007408 A1 * | 1/2003 | Lien et al. | 365/222 |
| 2003/0135794 A1 * | 7/2003 | Longwell et al. | 714/42 |
| 2004/0205426 A1 * | 10/2004 | Muranaka et al. | 714/704 |
| 2005/0022065 A1 * | 1/2005 | Dixon et al. | 714/42 |
| 2005/0073884 A1 * | 4/2005 | Gonzalez et al. | 365/185.02 |
| 2005/0281112 A1 * | 12/2005 | Ito et al. | 365/222 |
| 2007/0133315 A1 * | 6/2007 | Kang et al. | 365/189.05 |
| 2010/0106901 A1 * | 4/2010 | Higeta et al. | 711/106 |
| 2011/0231697 A1 * | 9/2011 | Berke et al. | 714/3 |

FOREIGN PATENT DOCUMENTS

| | | |
|---|---|---|
| EP | 0 301 794 | 2/1989 |
| JP | 55-163685 | 12/1980 |
| JP | 56-19599 | 2/1981 |
| JP | 56-165989 | 12/1981 |
| JP | 64-32489 | 2/1989 |
| JP | 07-334407 | 12/1995 |
| JP | 2002-025299 | 1/2002 |

OTHER PUBLICATIONS

International Search Report for PCT/JP2006/320911, mailed Jan. 16, 2007.
No Author Name Supplied in Source Data, "Method and apparatus for Maximizing Availability of an Embedded Dynamic Memory Cache", IP.COM Journal, IP.COM Inc., West Henrietta, NY, US, Jun. 19, 2003, ISSN: 1533-0001.

* cited by examiner

*Primary Examiner* — Yair Leibovich
(74) *Attorney, Agent, or Firm* — Staas & Halsey LLP (57) ABSTRACT

When a single error of data is detected by an ECC circuit, a cycle adjusting unit provided on a memory board shortens a refresh cycle T1 of a refresh request generating unit to T2 and causes a patrol controlling unit to intensively carry out an error patrol of an error-occurred address at a cycle T3, which is slightly longer than the changed refresh cycle T2. If an error is not detected for more than a predetermined period of time after the error patrol is started, the error patrol is stopped. Furthermore, if a single error is not detected for more than a predetermined period of time after the error patrol is stopped, the shortening of the refresh cycle is cancelled and returned to the original cycle.

6 Claims, 8 Drawing Sheets

FIG. 3A ERROR DETECTION NOTIFICATION

FIG. 3B PATROL REQUEST

FIG. 3C NUMBER OF NORMALITY

FIG. 3D REFRESH REQUEST

FIG. 4A ERROR DETECTION NOTIFICATION

FIG. 4B PATROL REQUEST

FIG. 4C NUMBER OF NORMALITY

FIG. 4D REFRESH REQUEST

FIG. 4E NUMBER OF REFRESH

MEMORY DEVICE AND REFRESH ADJUSTING METHOD

This application is a continuation of PCT/JP2006/320911 filed Oct. 20, 2006.

TECHNICAL FIELD

The present invention relates to a memory device such as a DRAM or a SDRAM having a refresh function of memory cells and to a refresh adjusting method and, particularly, relates to a memory device and a refresh adjusting method capable of dynamically changing refresh cycles.

BACKGROUND ART

Figure 7:
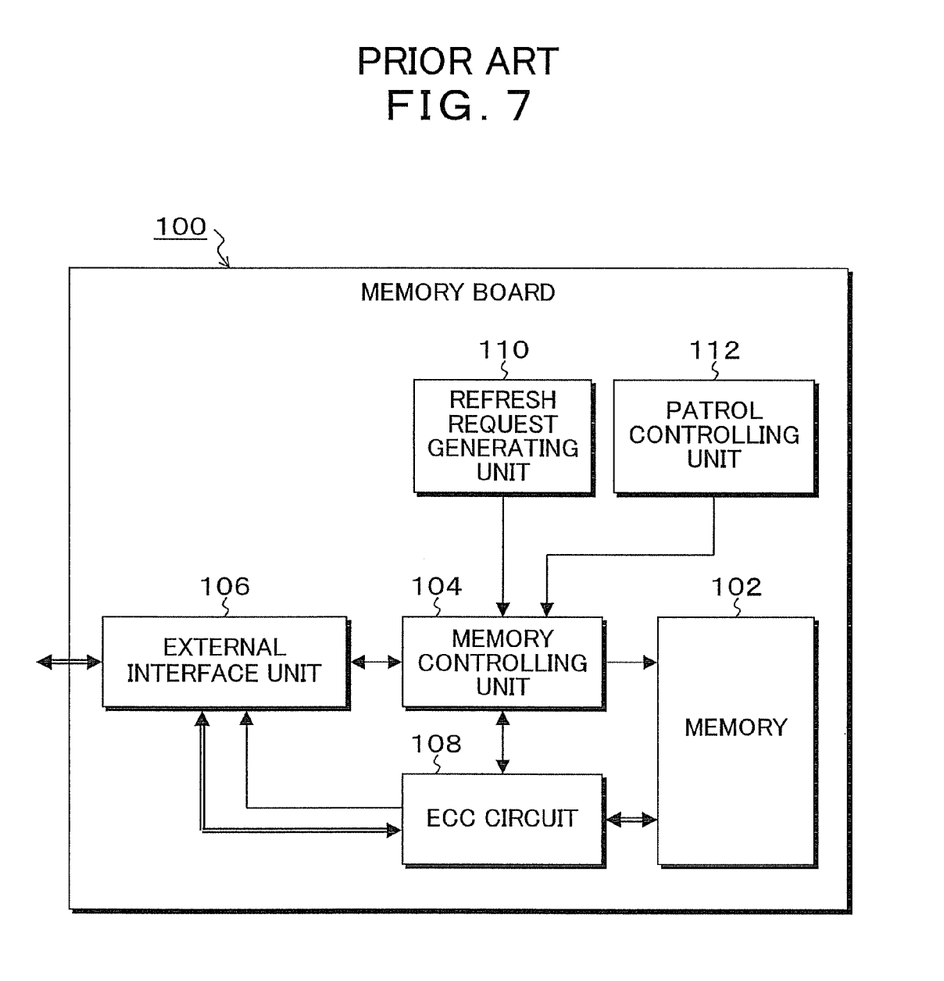
FIG. 7 is a block diagram showing a conventional memory device.

Conventionally, DRAMs and SDRAMs are known as memories that require refresh operations, are mounted, for example, on a memory board shown in FIG. 7, and are incorporated in and used in various information processing devices.

The conventional memory board 100 shown in FIG. 7 comprises a memory 102, a memory controlling unit 104, an external interface unit 106, an ECC circuit 108, a refresh request generating unit 110, and a patrol controlling unit 112.

The memory 102 is comprised of a DRAM, SDRAM, or the like; therefore, a refresh operation for retaining memory contents has to be periodically executed.

The memory controlling unit 104 outputs control signals at the timing, which is determined by a used device, and controls write and read of data with respect to the memory 102. The external interface unit 106 interfaces with a processor or a higher-level control device.

The ECC circuit 108 generates an error detecting and correcting code (check bit) according to control from the memory controlling unit 104 upon data write to the memory 102, adds the code to data, and writes the data to the memory 102; and, when the data is read from the memory 102, the ECC circuit checks normality of the data by using the error detecting and correcting code of the read data and, if a correctable error is detected, corrects the error of the data. As an algorithm for generating the error detecting and correcting code in the ECC circuit 108, for example, a single-error-correcting and double-error-detecting code is used.

The refresh request generating unit 110 is activated at a refresh interval, which is defined by specifications of the memory 102, gives a trigger to the memory controlling unit 104 so as to issue a refresh command, and causes the memory controlling unit 104 to issue the refresh command to the memory 102 so as to cause the memory 102 to carry out a refresh operation.

The patrol controlling unit 112 reads data from the memory 102 at a constant cycle, checks normality of the data by using the ECC circuit 108, and, if a correctable error is detected, corrects and writes back the data to the memory 102.

Operation of such memory board 100 is as follows. Based on an input/output request (write command or read command) received through the external interface unit 106, the memory controlling unit 104 outputs a control signal of the memory 102 and carries out write or read of data.

Upon write of data, the ECC circuit 108 is controlled at the same time; an error correcting code is generated from the data, added to the data, and written to the memory 102. Upon read of data, the memory controlling unit 104 controls the ECC circuit 108, carries out error detection according to the read data and the error correcting code thereof, corrects an error bit, and outputs the data.

When a single-error-correcting and double-error-detecting code is used as an error check code, single errors can be corrected; however, double errors cannot be corrected. Regarding detection of a double error, which cannot be corrected, error detection is notified to a processor, and the processor, which has received the notification, issues a correction write request.

The external interface unit 106 carries out communication with an external processor or a higher-level control device and requests the memory controlling unit 104 to write or read data to or from the memory 102. When, for example, a double error, which cannot be corrected, is detected by the ECC circuit 108, the external interface unit 106 relays a notification of the error detection to the processor or the higher-level control device.

The processor or the higher-level control device requests correction write with respect to this error notification, thereby recovering the error of the memory 102.

The refresh request generating unit 110 gives a refresh request to the memory controlling unit 104 at a cycle which is set in advance. When the memory controlling unit 104 receives the refresh request from the refresh request generating unit 110, the memory controlling unit 104 issues a refresh command to the memory 102. The memory 102, which has received the refresh command, subjects a memory array, which is specified by row addresses and column addresses, to one refresh operation by sequentially specifying the row addresses.

The patrol controlling unit 112 periodically reads the memory 102 and checks normality of data by the ECC circuit 108. When a single error is detected by the ECC circuit 108, corrected data is written back to the memory. This patrol of checking normality of the data is carried out for the entire address region of the memory 102.

Patent Document 1: Japanese Patent Application Laid-Open (kokai) No. 2002-25299
Patent Document 2: Japanese Patent Application Laid-Open (kokai) No. S56-165989
Patent Document 3: Japanese Patent Application Laid-Open (kokai) No. S55-163685
Patent Document 4: Japanese Patent Application Laid-Open (kokai) No. S56-019599

DISCLOSURE OF THE INVENTION

Problem to be Solved by the Invention

However, in such a conventional memory device, along with improvement of the integration degree of the memory device such as a DRAM or SDRAM, it is becoming difficult to ensure margins with respect to environmental conditions such as the voltage and temperature.

This is for the reason that, since individual characteristics of a memory element in the memory device are varied, when a memory element having small margins is contained, particular margins of the memory element are temporarily lowered in some cases due to, for example, temperature increase after operation initiation.

When the margins of the memory element are temporarily lowered like this, a single error is sometimes caused; however, the single error is corrected by the ECC circuit, and system failure is not immediately caused. However, when the malfunction state of the single error is left untouched for long time, the error may undergo a transition to a double error.

When the double error is generated, system failure of the memory device occurs; there is a need to carry out a process of notifying generation of the double error to, for example, an external processor, receiving a correction write request from the processor, and correcting the data of the memory, in which the double error occurs; and the time used for the correction write is increased, which is a cause that leads to deterioration of the original processing performance.

It is an object of the present invention to provide a memory device and a refresh adjusting method which prevent the transition to an uncorrectable error and improve reliability by dynamically changing the refresh cycle when a correctable error is detected by the ECC circuit.

Means for Solving the Problems (Device)

The present invention provides a memory device that requires refresh operations of memory elements.

The memory device of the present invention is characterized by having:

an external interface unit which interfaces with a higher-level device containing a processor;

a memory which stores data;

a memory controlling unit which controls write and read of data with respect to the memory;

an ECC circuit which generates an error detecting and correcting code and adds the code to data when the data is to be written to the memory and, when the data is read from the memory, corrects the data based on the error detecting and correcting code if an error is detected;

a refresh request generating unit which issues a refresh request at every predetermined refresh cycle and refreshes the memory;

a patrol controlling unit which periodically reads the data of the memory, checks normality of the data by the ECC circuit, and, if the error is detected, writes back corrected data to the memory; and a cycle adjusting unit which, when the error of the data is detected by the ECC circuit, shortens the refresh cycle of the refresh request generating unit and causes the patrol controlling unit to carry out an intensive patrol of an error-occurred address.

Herein, the cycle adjusting unit has:

a refresh cycle shortening unit which, when an error detection notification from the ECC circuit is received, instructs the refresh request generating unit to shorten the refresh cycle T1 to a shorter refresh cycle T2;

an error patrol request issuing unit which retains the error-occurred address received from the ECC circuit and issues an error patrol request for patrolling the error-occurred address at a cycle T3 slightly longer than the changed refresh cycle T2 to the patrol controlling unit;

an error patrol request cancelling unit which stops issuing of the error patrol request when an error detection notification of the error-occurred address is not received from the ECC circuit for more than a predetermined period of time after the error patrol request is issued; and a refresh cycle shortening canceling unit which cancels the shortening of the refresh cycle and returns the cycle to the original refresh cycle T1 when an error detection notification is not received from the ECC circuit for more than a predetermined period of time after issuing of the error patrol request is stopped.

When the patrol controlling unit receives the error patrol request from the cycle adjusting unit, the patrol controlling unit carries out a patrol of the error-occurred address in addition to the periodical patrol operation which is normally carried out.

When the ECC circuit detects a single error based on a check bit of the read data of the memory, the ECC circuit corrects the single error and transmits an error detection notification containing an error-occurred address to the cycle adjusting unit.

The memory contains a random access memory (DRAM) and a synchronous dynamic random access memory (SDRAM) which reads and writes data in synchronization with a clock signal supplied from outside.

(Method)

The present invention provides a refresh adjusting method of the memory device. The present invention is a refresh adjusting method of a memory device having:

an external interface unit which interfaces with a higher-level device containing a processor;

a memory which stores data;

a memory controlling unit which controls write and read of the memory;

an ECC circuit which generates an error detecting and correcting code and adds the code to data when the data is to be written to the memory and, when the data is read from the memory, corrects the data based on the error detecting and correcting code if an error is detected;

a refresh request generating unit which issues a refresh request at every predetermined refresh cycle to the memory; and a patrol controlling unit which periodically reads the data of the memory, checks normality of the data by the ECC circuit, and, if the error is detected, writes back corrected data to the memory; the refresh adjusting method of the memory device characterized by, when the error of the data is detected by the ECC circuit, shortening the refresh cycle of the refresh request generating unit and causing the patrol controlling unit to carry out an intensive patrol of an error-occurred address.

Effect of the Invention

According to the present invention, when, for example, a single error of data, which can be corrected, is detected by the ECC circuit, the refresh cycle is shortened, and the error patrol of the error-occurred address is intensively carried out at the cycle slightly longer than the changed refresh cycle. Therefore, even when a single error occurs in an element having small margins under the environment in which operation conditions such as temperature increase after operation initiation are varied, the transition to an uncorrectable double error caused by continuation of the single error is prevented so that the single error is not continued by the refresh operation at the changed short cycle, and the occurrence frequency of correction write with respect to double errors which cause system failure is suppressed. Thus, reliability of the memory device can be improved while minimally suppressing deterioration of the performance of the system.

In the state in which the refresh cycle is shortened, the memory patrol is intensively carried out on the error-occurred address where a single error is detected, thereby measuring the effect of the adjustment by shortening the refresh cycle.

When the adjustment effect is confirmed, the refresh cycle is returned to the original cycle so that the adjustment state by shortening of the refresh cycle is not continued more than necessity, and increase of the processing load and power consumption of the memory device is prevented.

BEST MODE FOR CARRYING OUT THE INVENTION

Figure 1:
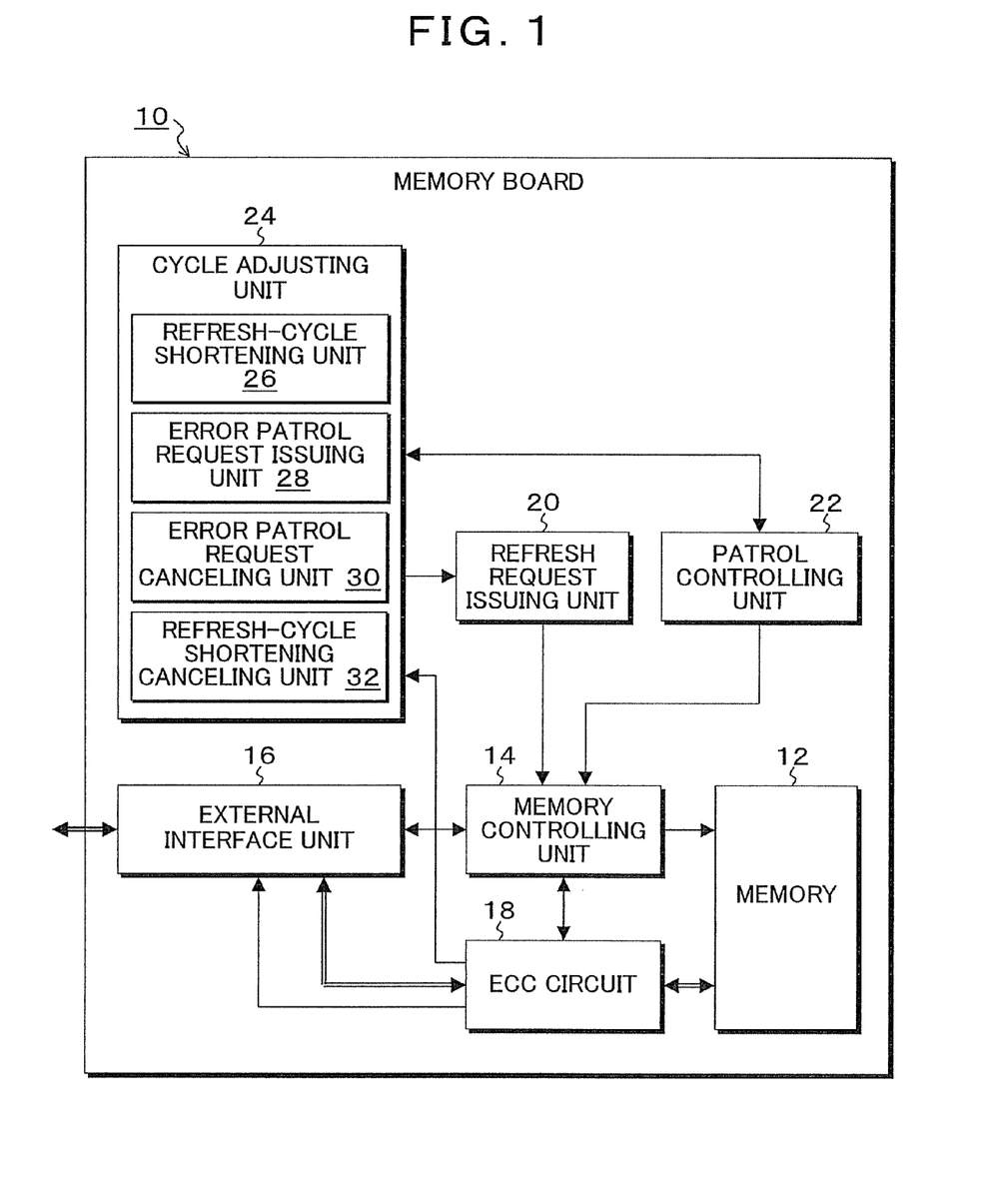
FIG. 1 is a block diagram showing an embodiment of a memory device according to the present invention.

FIG. 1 is a block diagram showing an embodiment of a memory device according to the present invention.

In FIG. 1, the memory device of the present embodiment is realized as a memory board 10. A memory 12, a memory controlling unit 14, an external interface unit 16, an ECC circuit 18, a refresh request generating unit 20, a patrol controlling unit 22, and a cycle adjusting unit 24 are provided in the memory board 10.

In the cycle adjusting unit 24, as processing functions thereof, a refresh-cycle shortening unit 26, an error patrol request issuing unit 28, an error patrol request cancelling unit 30, and a refresh-cycle shortening cancelling unit 32 are provided.

The memory 12 is a memory device such as a DRAM or a SDRAM and uses, for example, DDR2 SDRAM of MICRON Technology Inc. The memory controlling unit 14 outputs control command signals at the timing that is determined by the memory device used as the memory 12 and controls write and read of data, a refresh operation, and a patrol operation with respect to the memory 12.

The external interface unit 16 controls interfacing with a processor of an information device incorporating the memory board 10 or a higher-level device containing another control device. The interface control by the external interface unit 16 includes, for example, reception of a read command or a write command from the processor, responding read data to the processor, and transmitting memory status information to the processor.

When data is to be written to the memory 12 by control of the memory controlling unit 14, the ECC circuit 18 generates an error detecting and correcting code (check bit) from write data, adds the code to the data, and writes the data to the memory 12.

When data is read from the memory 12 by control of the memory control circuit 14, the ECC circuit 18 checks normality of the data by using the read data and the error detecting and correcting code thereof and, if a correctable error is detected, corrects the error of the data.

In the ECC circuit 18 of the present embodiment, the case in which, for example, a single-error-correcting and a double-error-detecting code is used as an error detecting and correcting code is taken as an example.

Therefore, when a single error (individual error) is detected from the read data, the ECC circuit 18 corrects this. On the other hand, when an error of a double error or a larger error is detected, error correction cannot be carried out; therefore, it is notified as system failure to a processor, which is serving as a higher-level device, via the external interface unit 16, and, in response to a correction request from the processor, a correction write process of the data, in which the double error has occurred, is carried out.

The refresh request generating unit 20 is activated at a refresh cycle T1, which is defined by specifications of the memory 12, and outputs a trigger signal for generating a refresh command to the memory controlling unit 14. In response to the trigger signal, the memory controlling unit 14 issues the refresh command to the memory 12 so as to cause the memory to carry out a refresh operation.

The patrol controlling unit 22 reads data from the memory 12 at a constant cycle T4, checks normality of the data by using the ECC circuit 18, and, if a single error, which is a correctable error, is detected, corrects and writes back the data to the memory 12.

Such memory 12, memory controlling unit 14, external interface unit 16, ECC circuit 18, refresh request generating unit 20, and patrol controlling unit 22 are basically same as those of the case of the conventional memory board 100 shown in FIG. 7. However, in addition to them, in the present invention, the cycle adjusting unit 24 is newly provided.

When a correctable error of data is detected by the ECC circuit 18, specifically when a single error of the data is detected, the cycle adjusting unit 24 shortens the refresh cycle of the refresh request generating unit 20 from the normal refresh cycle T1 to a shorter refresh cycle T2, and causes the patrol controlling unit 22 to carry out an intensive patrol of an error-occurred address where the single error is detected, in addition to normal patrol control.

Such functions of the cycle adjusting unit 24 are realized as functions of the refresh-cycle shortening unit 26, the error patrol request issuing unit 28, the error patrol request canceling unit 30, and the refresh-cycle shortening canceling unit 32.

When a detection notification of a single error from the ECC circuit 18 is received, the refresh-cycle shortening unit 26 instructs the refresh request generating unit 20 to shorten the refresh cycle from the normal cycle T1 to the shorter cycle T2.

The error patrol request issuing unit 28 retains the error-occurred address received from the ECC circuit 18 and, issues an error patrol request for patrolling the error-occurred address to the patrol controlling unit 22 at a cycle T3 which is slightly longer than the refresh cycle T2 after the change by the refresh-cycle shortening unit 26.

When a detection notification of a single error of the error-occurred address is not received from the ECC circuit 18 for predetermined time or more after the error patrol request is issued, the error patrol request canceling unit 30 stops the error patrol request issued to the patrol controlling unit 22.

When an error detection notification is not received from the ECC circuit 18 for predetermined time or more after issuing of the error patrol request is stopped, the refresh-cycle shortening canceling unit 32 cancels the shortening of the refresh cycle with respect to the refresh request generating unit 20 and returns the cycle to the original cycle T1.

Corresponding to such a refresh cycle shortening function and an error patrol requesting function of the cycle adjusting unit 24, the refresh request generating unit 20 has a function of carrying out setting change of the refresh cycle from the normal cycle T1 to the cycle T2 of the shortening-requested case. The patrol controlling unit 22 has a function of carrying out, in addition to the patrol of the cycle T4 which is normally carried out, an intensive patrol on the error-occurred address at the cycle T3, which is slightly longer than the refresh cycle T2 after change when the error patrol request is received from the cycle adjusting unit 24.

Herein, the functions of the refresh-cycle shortening unit 26, the error patrol request issuing unit 28, the error patrol request canceling unit 30, and the refresh-cycle shortening canceling unit 32 provided in the cycle adjusting unit 24 can be constituted as control logics by hardware or also realized by program execution of firmware executed by a processor provided in the cycle adjusting unit 24.

Figure 2:
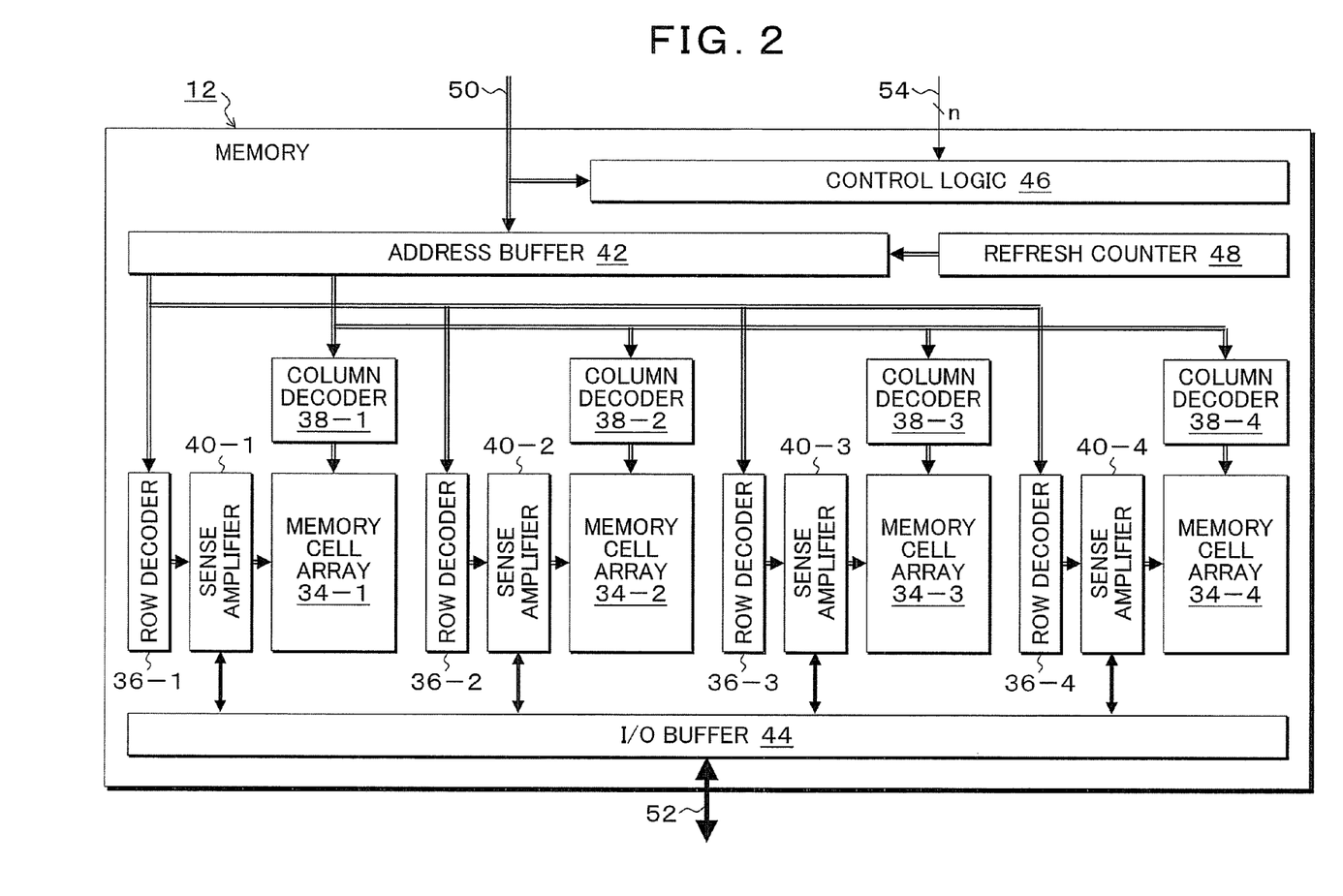
FIG. 2 is a block diagram showing an embodiment of a memory of FIG. 1.

FIG. 2 is a block diagram showing an embodiment of the memory 12 provided on the memory board 10 of FIG. 1. In FIG. 2, a memory cell array having a 4-bank configuration is taken as an example of the memory 12, and memory cell arrays 34-1, 34-2, 34-3, and 34-4 are provided.

Row decoders 36-1 to 36-4, column decoders 38-1 to 38-4, and sense amplifiers 40-1 to 40-4 are provided, respectively, with respect to the memory cell arrays 34-1 to 34-4.

An address buffer 42 is provided with respect to the row decoders 36-1 to 36-4 and the column decoders 38-1 to 38-4, decodes row addresses and column addresses specified by an address bus 50 from the memory controlling unit 14 of FIG. 1, accesses the data, where the corresponding memory is present, by using, for example, a word (8 bits) as a minimum unit, and carries out a write operation or a read operation.

Therefore, an IO buffer 44 is provided with respect to the sense amplifiers 40-1 to 40-4, and a data bus 52 from the external interface unit 16 of FIG. 1 is connected to the IO buffer 44 via the ECC circuit 18.

In addition, in the memory 12, a control logic 46 and a refresh counter 48 are provided. The address bus 50 and a control command line 54 from the memory controlling unit 14 are input to the control logic 46, and the control logic 46 carries out control drive of the memory 12 based on a control command signal based on the control command line 54.

As the control drive of the memory 12 carried out by the control logic 46, a write operation, a read operation, a refresh operation, and a patrol operation are main control operations.

The refresh counter 48 is also provided in the memory 12. When a refresh command from the memory controlling unit 14 of FIG. 1 is received by the control logic 46, the column addresses of the memory cell arrays 34-1 to 34-4 determined by the refresh counter 48 are sequentially specified, and one refresh operation is executed.

Herein, the number of rows in each of the 4-bank memory cell arrays 34-1 to 34-4 is, for example, 8192, and the four banks are simultaneously refreshed upon refresh execution. Therefore, when the refresh counter 48 receives a one-time refresh command, the refresh counter sequentially generates row addresses corresponding to 8192 rows and executes the refresh operation of all the memory elements (cells) in the memory cell arrays 34-1 to 34-4.

The cycle of the refresh operation carried out by sequentially generating the 8192 row addresses is, for example, 64 ms; therefore, the refresh cycle per one row address is 7.8125 μs.

The refresh operation with respect to the memory elements provided in the memory cell arrays 34-1 to 34-4 has the same operation procedure as that of a read operation except that data output is eliminated, and the procedure is as follows.

(1) A precharge switch is turned on, and an internal data line is caused to have the voltage same as the voltage (sense amplifier threshold voltage) of a precharge power source line.

(2) The precharge switch is turned off. At this point, the precharged voltage is retained in the internal data line by parasitic capacitance.

(3) A word line is selected, and a voltage is supplied thereto. Consequently, the source and the drain of a FET of the memory element are conducted, and the information of the capacitor appears in the internal data line. At this point, the internal data line is at the precharge voltage (threshold voltage). Therefore, in the case of data 1 in which charge is present in the capacitor, the voltage value exceeds the threshold voltage; and, in the case of data 0 having no charge, the voltage value is lower than the threshold voltage.

(4) The sense amplifier is operated, and the voltage of the internal data line is converted to the voltage corresponding to 0 or 1 by using the threshold voltage as a reference and output. At this point, the same data is stored again in the capacitor of the memory element.

Next, with reference to time charts of FIGS. 3A to 3D and FIGS. 4A to 4E, a refresh adjusting operation in the embodiment of FIG. 1 will be explained.

Figure 3A:
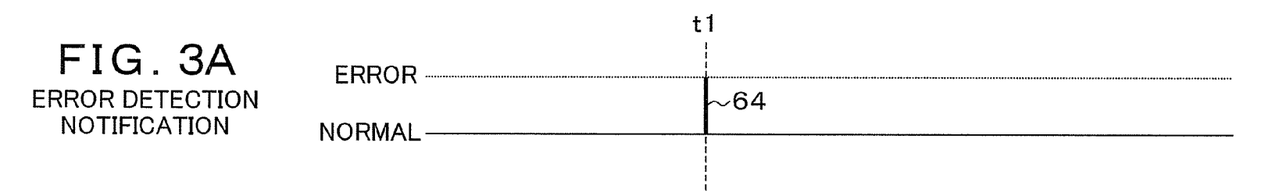
FIGS. 3A to 3D are time charts showing a refresh adjusting process according to the present embodiment.
Figure 3B:
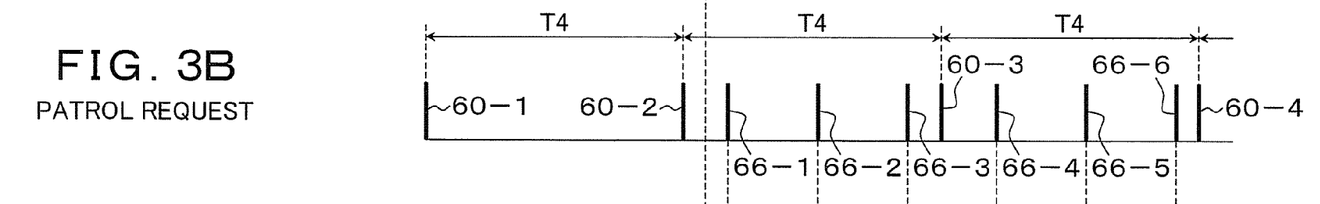
Figure 3C:
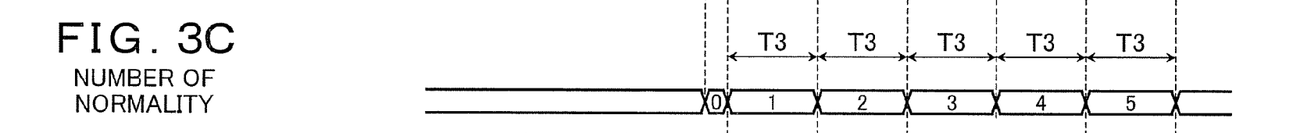
Figure 3D:
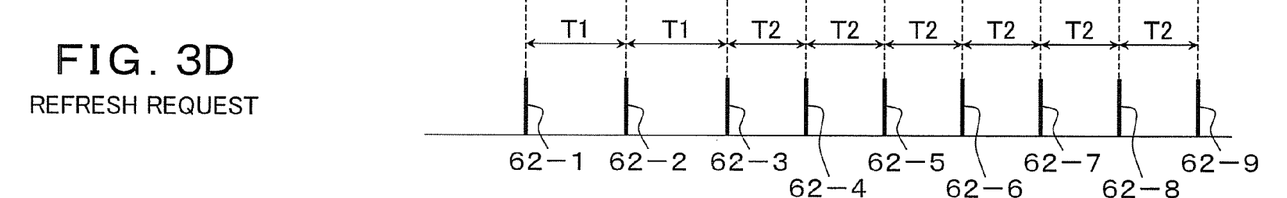

FIG. 3A shows an error detection notification of the ECC circuit 18, FIG. 3B shows patrol operations of the patrol controlling unit 22, FIG. 3C shows the number of times of normality according to the ECC circuit 18 with respect to error patrol requests from the cycle adjusting unit 24 to the patrol controlling unit 22; and FIG. 3D shows refresh requests from the refresh request generating unit 20.

In FIGS. 3A to 3D, in a normal case, the patrol controlling unit 22 outputs patrol trigger signals 60-1, 60-2, 60-3, and 60-4 at the cycle T4 as shown in FIG. 3B. In response to the patrol trigger signals 60-1 and 60-2, the memory controlling unit 14 issues a patrol command to the memory 12 and causes the memory to carry out patrol operations.

Meanwhile, the refresh request generating unit 20 outputs refresh trigger signals 62-1 and 62-2 to the memory controlling unit 14 at the cycle T1 in a normal case. When the refresh trigger signal 62-1 or 62-2 is received, the memory controlling unit 14 issues a refresh command to the memory 12 and causes the memory to carry out a refresh operation corresponding to, for example, 8192 rows during the cycle T1.

In this case, for example, if the ECC circuit 18 detects a correctable single error at time t1 from read data of the memory 12, an error detection notification 64 of FIG. 3A is received by the cycle adjusting unit 24, and, at the same time, an error-occurred address where the single error is detected is received and retained.

When the error detection notification 64 of the single error is received at the time t1, the refresh cycle shortening unit 26 of the cycle adjusting unit 24 is operated and requests setting change of the refresh cycle from the previous cycle T1 to the shorter cycle T2 to the refresh request generating unit 20.

Therefore, after the time t1, the refresh request generating unit 20 generates refresh trigger signals 62-3, 62-4, 62-5, . . . at the short refresh cycle T2 after the setting change, and, according to refresh commands from the memory controlling unit 14, the memory 12 carries out refresh operations at the cycle T2, which is shorter than the previous cycle T1. Thus, the refresh operations of the memory 12, wherein the single error has been detected, can be carried out at short time intervals, and the voltage of the capacitor of the memory element which is the cause of the single error can be recovered to an appropriate voltage in a short period of time.

Also, when the error detection notification of the single error is received at the time t1, the error patrol request issuing unit 28 of the cycle adjusting unit 24 issues an error patrol request with respect to the error-occurred address to the patrol controlling unit 22.

In response to this, as shown in FIG. 3B, the patrol controlling unit 22 generates, in addition to the normal patrol trigger signals 60-1, 60-2, 60-3, 60-4, . . . implemented at the cycle T4, additional patrol trigger signals 66-1, 66-2, 66-3, . . . corresponding to the error patrol request at the cycle T3 which is slightly longer than the changed refresh cycle T2, wherein the additional patrol trigger signals are synchronized with the refresh trigger signal 62-3, which is the first one after the change, after the time t1.

The memory controlling unit 14, which has received the additional patrol trigger signals 66-1, 66-2, 66-3, . . ., issues a patrol command to the memory 12 by specifying the error-occurred address. As a result, additional patrol operations are executed for the error-detected address immediately after the refresh operation is carried out, and the effect of the adjustment of the error-occurred address accompanying the refresh operations at the shortened refresh cycle is measured.

The refresh operations by the shortened refresh cycle T2 after the time t1 are carried out until normality of the error-occurred address is continued for more than a certain period of time according to the ECC circuit 18.

Specifically, with respect to the data of the error-detected address that is read upon the patrol operations according to the additional patrol trigger signals 66-1, 66-2, 66-3, . . . of the cycle T3 based on the error patrol request with respect to the patrol controlling unit 22, the number of times of normality detection by the ECC circuit 18 is counted by the error patrol request canceling unit 30 provided in the cycle adjusting unit 24; and, when it reaches a predetermined number of times N, which is determined in advance, the error patrol request with respect to the patrol controlling unit 22 is cancelled.

Figure 4A:
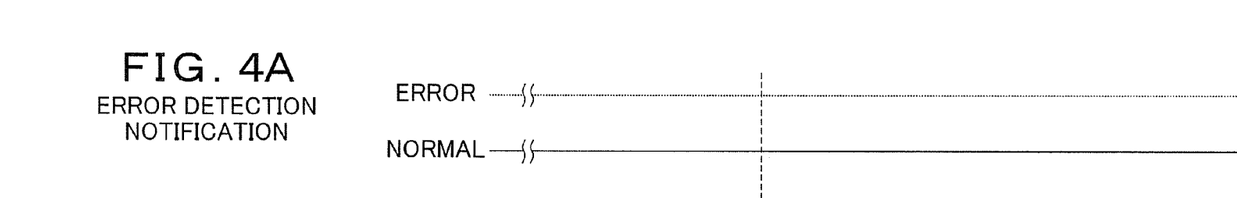
FIGS. 4A to 4E are time charts showing the refresh adjusting process subsequent to FIGS. 3A to 3D.
Figure 4B:
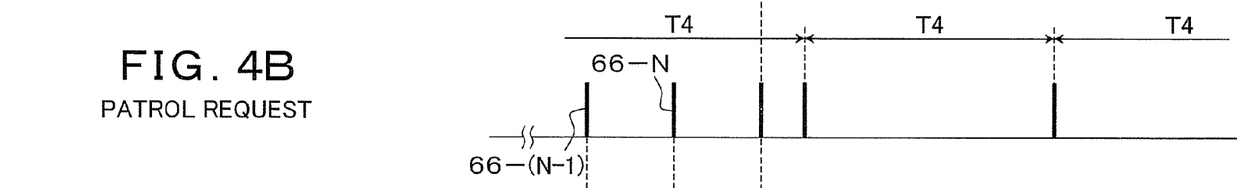
Figure 4C:
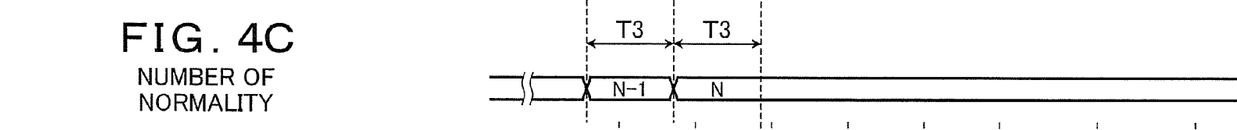

More specifically, as shown by the number of times of normality of FIG. 4C, the error patrol request canceling unit 30 cancels the error patrol request with respect to the patrol controlling unit 22 at the timing of time t2 after the cycle T3 is elapsed after the number of times of normality of the error detection by the ECC circuit 18 reaches N in the patrol operation accompanying an additional patrol trigger signal 66-N. Therefore, the patrol trigger signal from the patrol controlling unit 22 returns to the normal state of the cycle T4.

Furthermore, when an error detection notification of a single error is not obtained from the ECC circuit 18 for predetermined period of time T5 after the error patrol request is cancelled at the time t2, the refresh-cycle shortening canceling unit 32 provided in the cycle adjusting unit 24 cancels the setting change with respect to the refresh request generating unit 20 at the time t3 and returns the cycle to the original cycle T1.

Figure 4D:
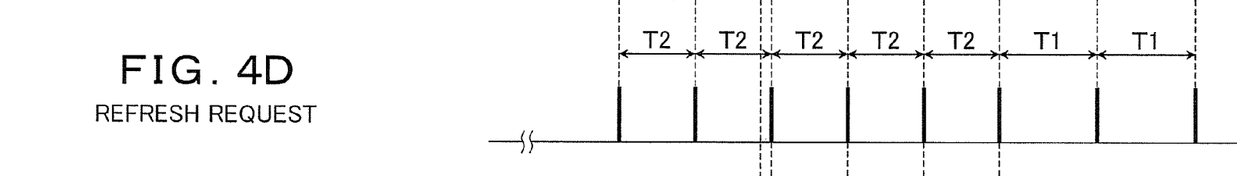
Figure 4E:
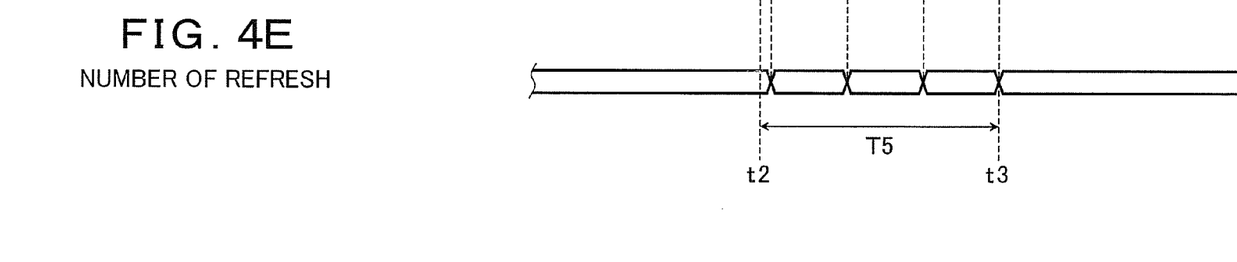

Specifically, as shown in FIG. 4D, refresh trigger signals after the error patrol request is cancelled at the time t2 are counted, the shortening of the refresh cycle is cancelled at the timing of the time t3 when three times of refreshing is counted, and the cycle is returned to the normal cycle T1.

Figure 5A:
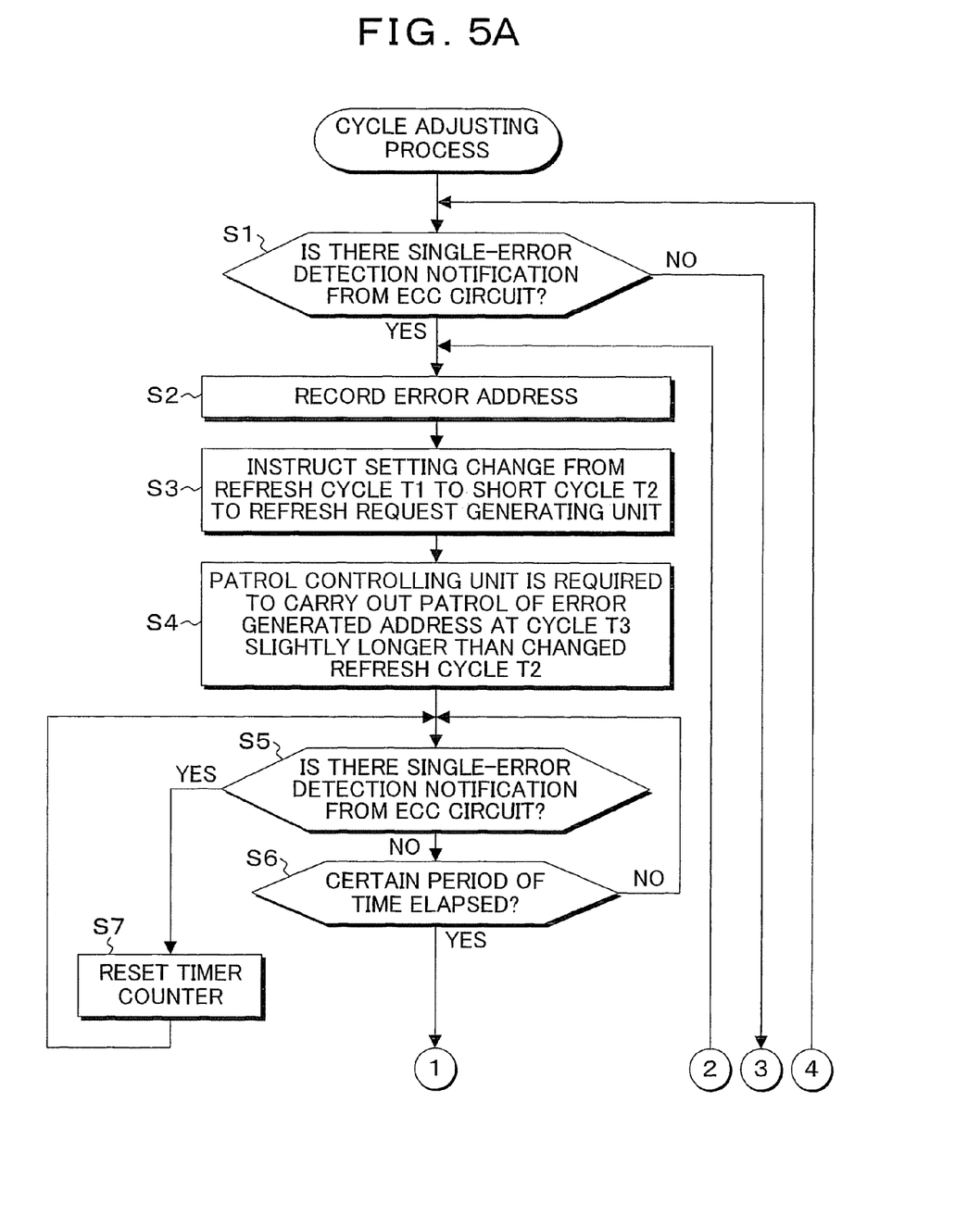
FIGS. 5A and 5B are flow charts showing a processing procedure of a refresh adjusting unit of FIG. 1.
Figure 5B:
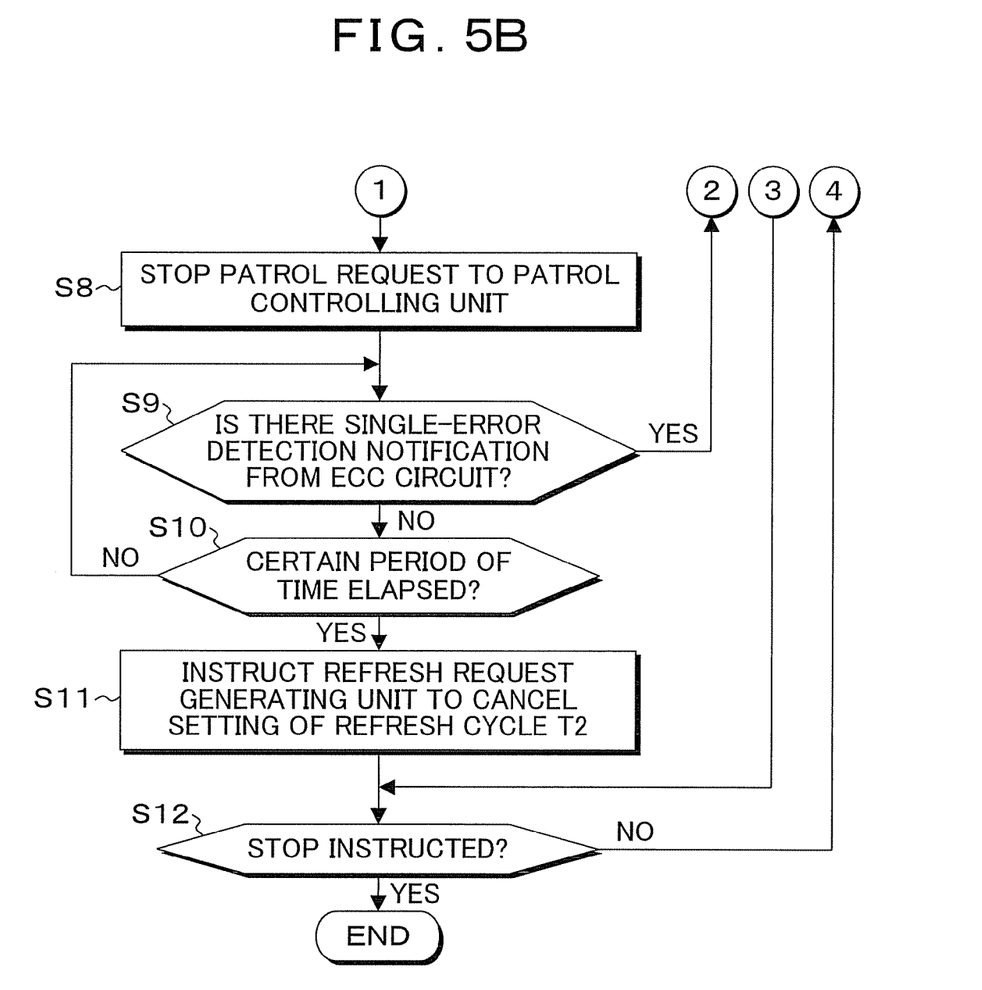

FIGS. 5A and 5B are flow charts showing a processing procedure of the cycle adjusting unit 24 of FIG. 1 and, at the same time, shows program contents of the case in which the functions of the cycle adjusting unit 24 are realized by execution of programs such as firmware.

In FIGS. 5A and 5B, in a cycle adjusting process, first, when a detection notification of a single error from the ECC circuit 18 is received at step S1, the error-occurred address is recorded at step S2, and then, the refresh-cycle shortening unit 26 instructs the refresh request generating unit 20 to carry out setting change from the previous cycle T1 to the shorter cycle T2 at step S3.

Subsequently, at step S4, the error patrol request issuing unit 28 issues an error patrol request of requesting implementation of patrol of the error-occurred address at the cycle T3, which is slightly longer than the refresh cycle T2, to the patrol controlling unit 22.

Subsequently, at step S5, presence of the error detection notification of a single error about the data read by the execution of the additional patrol control accompanying the error patrol request from the ECC circuit 18 is checked. When the state that there is no error detection notification of the single error is continued for a certain period of time at step S6, the process proceeds to step S8, wherein the error patrol request cancelling unit 30 cancels issuing of the error patrol request with respect to the patrol controlling unit 22 and causes the unit to stop the additional patrol.

On the other hand, when there is the error detection notification of the single error from the ECC circuit 18 before the certain period of time is elapsed at step S5, a timer counter counting elapse of the certain period of time of step S6 is reset at step S7, and the process from step S5 is repeated again.

When the error patrol request with respect to the patrol controlling unit 22 is stopped at step S8, the detection notification of the single error from the ECC circuit 18 is monitored again at step S9. When it is determined that the detection notification of the single error is not continued for a certain period of time at step S10, the process proceeds to step S11, wherein the refresh request generating unit 20 is instructed to cancel the setting of the refresh cycle T2, and it is returned to the normal refresh cycle T1.

Note that, if there is the detection notification of the single error from the ECC circuit 18 before the certain period of time is elapsed at step S9, the process returns to step S2, and the cycle adjusting process with respect to the new single error is started.

Such processes of steps S1 to S11 are repeated until there is a stop instruction at step S12.

Figure 6:
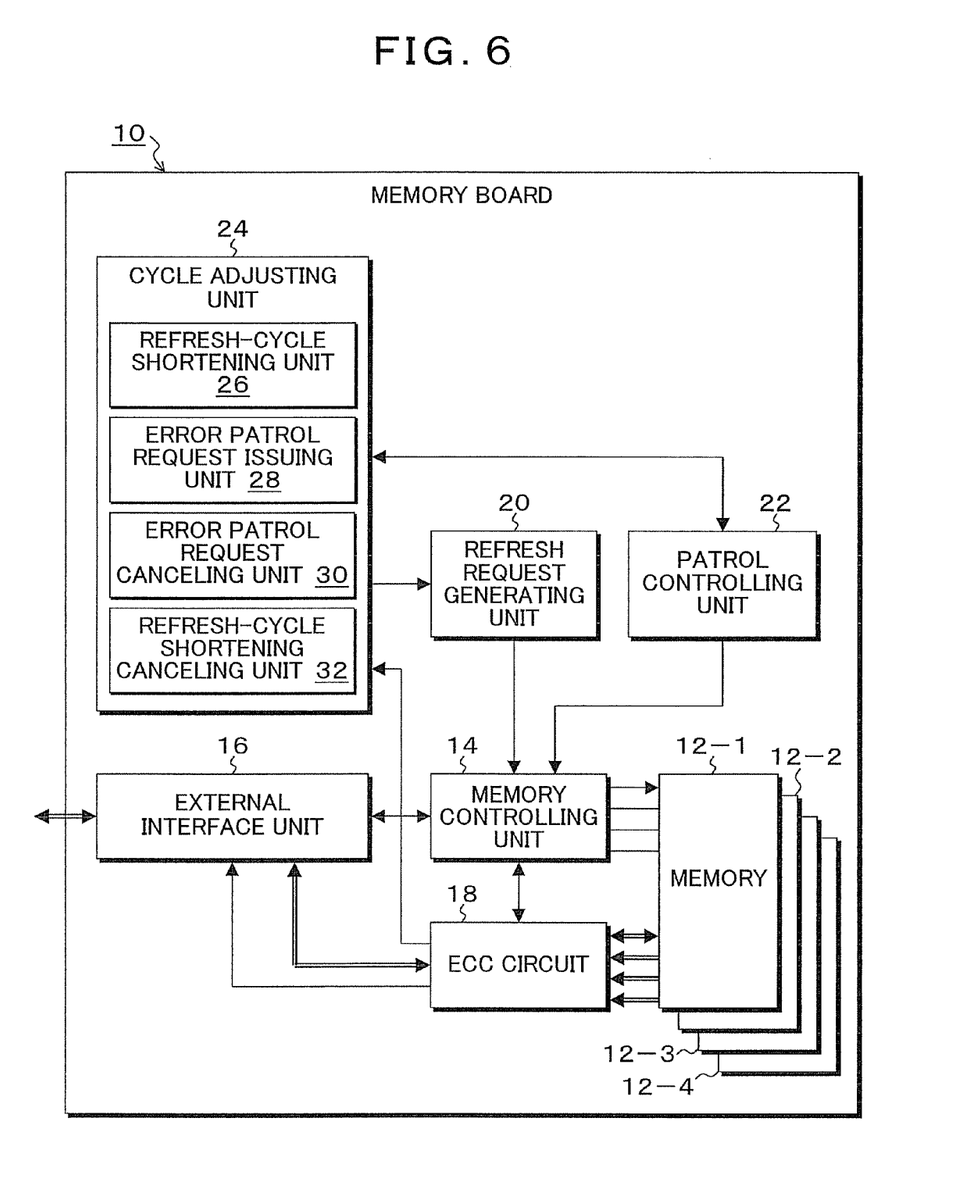
FIG. 6 is a block diagram showing another embodiment of the memory device according to the present invention.

FIG. 6 is a block diagram showing another embodiment of the memory device according to the present invention, and this embodiment is characterized in that a plurality of memories 12-1 to 12-4 are mounted on the memory board 10.

In FIG. 6, on the memory board 10, as well as the embodiment of FIG. 1, the memory controlling unit 14, the external interface unit 16, the ECC circuit 18, the refresh request generating unit 20, the patrol controlling unit 22, and the cycle adjusting unit 24 are provided; in the cycle adjusting unit 24, the functions of the refresh-cycle shortening unit 26, the error patrol request issuing unit 28, the error patrol request canceling unit 30, and the refresh-cycle shortening canceling unit 32 are provided; and, from this point, the configuration and operation are same as that of the embodiment of FIG. 1.

On the other hand, as memories of the memory board 10, in the present embodiment, the four memories 12-1 to 12-4 are provided so as to multiply the memory capacity by four. Each of the memories 12-1 to 12-4 has the same configuration as the memory 12 shown in FIG. 2.

In the case in which the plurality of memories 12-1 to 12-4 are provided in this manner, when a refresh trigger signal from the refresh request issuing unit 20 is received, the memory controlling unit 14 parallelly issues refresh commands to the four memories 12-1 to 12-4, and refresh operations, wherein, for example, 8192 row addresses are sequentially specified in each refresh operation as shown in FIG. 2, are parallelly repeated for the memories 12-1 to 12-4.

With respect to this, when a patrol trigger signal is received from the patrol controlling unit 22, the memory controlling unit 14 specifies memory addresses in the order of the memories 12-1, 12-2, 12-3, and 12-4 so as to carry out patrol operations.

Therefore, compared with the case of FIG. 1 in which one memory 12 is provided, the cycle of one patrol operation requires a quadruple patrol cycle since the four memories 12-1 to 12-4 are provided in the embodiment of FIG. 6.

When the memories 12-1 to 12-4 are provided, since the memories 12-1 to 12-4 can be individually and parallelly subjected to refresh operations, shortening of the refresh cycle by the cycle adjusting unit 24 may be carried out merely for the memory in which a single error is detected or may be carried out for all of the four memories 12-1 to 12-4.

When, for example, single errors are detected overlappingly in two of the memories 12-1 to 12-4, an additional patrol for checking the refresh cycle adjusting effect accompanying shortening of the refresh cycle is carried out for each of the error-occurred addresses.

In the above described embodiments, as the memories that require refresh operations, DRAMs and SDRAMs are taken as examples; however, the present invention is not limited thereto, but can be applied without modification to arbitrary memory devices that require refresh operations.

In the above described embodiments, as the ECC circuit, the case in which the single-error-correcting and double-error code is used is taken as an example; however, the code is not limited to this, and an error detecting and correcting code having an arbitrary detecting and correcting ability may be used.

The degree of shortening of the refresh cycle upon single error detection in the above described embodiments may be an arbitrary shortening rate so that the cycle T2 is shorter than the normal refresh cycle T1, and the shortenable degree of the refresh cycle T2 is determined by the used memory device used by the memory 12.

In the above described embodiments, the state that the error detection notification is not obtained more than the certain time is determined by counting the trigger signal by the counter; however, time elapse may be determined by using a timer.

The present invention includes arbitrary modifications that do not impair the objects and advantages thereof, and the present invention is not limited by the numerical values shown in the above described embodiments.

The invention claimed is:

1. A memory device comprising:
    an external interface unit which interfaces with a higher-level device;
    a memory which stores data;
    a memory controlling unit which controls write and read of data with respect to the memory;
    an ECC circuit which generates an error detecting and correcting code and adds the code to data when the data is to be written to the memory and, when the data is read from the memory, corrects the data based on the error detecting and correcting code if an error is detected;
    a refresh request generating unit which issues a refresh request at every refresh cycle and refreshes the memory;
    a patrol controlling unit which periodically reads the data of the memory, checks and counts normality occurrences of the data by the ECC circuit, and, if any error is detected, writes back corrected data to the memory;
    a cycle adjusting unit which, shortens the refresh cycle of the refresh request generating unit and causes the patrol controlling unit to patrol an error-occurred address in addition to a periodic patrol operation which is normally carried out, when the error of the data is detected by the ECC circuit;
    a refresh cycle shortening unit which, instructs the refresh request generating unit to shorten the refresh cycle when an error detection notification from the ECC circuit is received;
    an error patrol request issuing unit which retains the error-occurred address received from the ECC circuit and issues an error patrol request for patrolling the error-occurred address at a cycle slightly longer than the changed refresh cycle to the patrol controlling unit;
    an error patrol requesting unit which stops issuing of the error patrol request when an error detection notification of the error-occurred address is not received from the ECC circuit for more than a predetermined period of time after the error patrol request is issued and when a normality count reaches a threshold; and
    a refresh cycle shortening canceling unit which cancels the shortening of the refresh cycle and returns the cycle to the original cycle when an error detection notification is not received from the ECC circuit for more than a predetermined period of time after issuing of the error patrol request is stopped and when a normality count reaches a threshold,
    when the patrol controlling unit receives the error patrol request from the cycle adjusting unit, the patrol controlling unit carries out a patrol of the error-occurred address in addition to the periodical patrol operation which is normally carried out.

2. The memory device according to claim 1, wherein
    the ECC circuit corrects a single error and transmits an error detection notification containing an error-occurred address to the cycle adjusting unit when the ECC circuit detects the single error based on the error detecting and correcting code of the read data of the memory.

3. The memory device according to claim 1, wherein the memory contains a random access memory (DRAM) and a synchronous dynamic random access memory (SDRAM) which reads and writes data in synchronization with a clock signal supplied from outside.

4. A refresh adjusting method of a memory device comprising:
    an external interface unit which interfaces with a higher-level device containing a processor;
    a memory which stores data;
    a memory controlling unit which controls write and read of data with respect to the memory;
    an ECC circuit which generates an error detecting and correcting code and adds the code to data when the data is to be written to the memory and, when the data is read from the memory, corrects the data based on the error detecting and correcting code if an error is detected;
    a refresh request generating unit which issues a refresh request at every predetermined refresh cycle and refreshes the memory; and
    a patrol controlling unit which periodically reads the data of the memory, checks and counts normality occurrences of the data by the ECC circuit, and, if an error is detected, writes back corrected data to the memory;
    wherein when the error of the data is detected by the ECC circuit, shortening the refresh cycle of the refresh request generating unit and causing the patrol controlling unit to patrol an error-occurred address in addition to a periodic patrol operation which is normally carried out,
    wherein when an error detection notification from the ECC circuit is received, instructing the refresh request generating unit to shorten the refresh cycle;

retaining the error-occurred address received from the ECC circuit and issuing an error patrol request for patrolling the error-occurred address at a cycle slightly longer than the changed refresh cycle to the patrol controlling unit;

stopping issuing of the error patrol request when an error detection notification of the error-occurred address is not received from the ECC circuit for more than a predetermined period of time after the error patrol request is issued and when a normality count reaches a threshold; and cancelling the shortening of the refresh cycle and returning the cycle to the original cycle when an error detection notification of the error-occurred address is not received from the ECC circuit for more than a predetermined period of time after issuing of the error patrol request is stopped and when a normality count reaches a threshold, when the error patrol request is received, the patrol controlling unit is caused to carry out a patrol of the error-occurred address in addition to the periodical patrol operation which is normally carried out.

5. The refresh adjusting method of the memory device according to claim 4, wherein when the ECC circuit detects a single error based on the error detecting and correcting code of the read data of the memory, the ECC circuit is caused to correct the single error and transmit an error detection notification containing an error-occurred address.

6. The refresh adjusting method of the memory device according to claim 4, wherein the memory contains a random access memory (DRAM) and a synchronous dynamic random access memory (SDRAM) which reads and writes data in synchronization with a clock signal supplied from outside.

* * * * *